United States Patent
Haeusler

(10) Patent No.: US 8,648,432 B2
(45) Date of Patent: Feb. 11, 2014

(54) FULLY EMBEDDED MICROMECHANICAL DEVICE, SYSTEM ON CHIP AND METHOD FOR MANUFACTURING THE SAME

(75) Inventor: Alfred Haeusler, Freising (DE)

(73) Assignee: Texas Instruments Deutschland GmbH, Freising (DE)

(*) Notice: Subject to any disclaimer, the term of this patent is extended or adjusted under 35 U.S.C. 154(b) by 0 days.

(21) Appl. No.: 13/305,536

(22) Filed: Nov. 28, 2011

(65) Prior Publication Data

US 2013/0134531 A1   May 30, 2013

(51) Int. Cl.
*H01L 29/84* (2006.01)
*H01L 21/302* (2006.01)

(52) U.S. Cl.
USPC .............. 257/418; 257/E29.324; 257/E21.52; 438/52

(58) Field of Classification Search
None
See application file for complete search history.

(56) References Cited

U.S. PATENT DOCUMENTS

| | | | | |
|---|---|---|---|---|
| 5,576,250 | A * | 11/1996 | Diem et al. | 438/50 |
| 5,616,514 | A * | 4/1997 | Muchow et al. | 438/50 |
| 5,616,523 | A * | 4/1997 | Benz et al. | 438/50 |
| 6,055,858 | A * | 5/2000 | Muenzel et al. | 73/504.12 |
| 6,433,401 | B1 * | 8/2002 | Clark et al. | 257/524 |
| 6,524,878 | B2 * | 2/2003 | Abe et al. | 438/52 |
| 6,635,509 | B1 * | 10/2003 | Ouellet | 438/106 |
| 6,913,941 | B2 * | 7/2005 | O'Brien et al. | 438/50 |
| 6,916,728 | B2 * | 7/2005 | Gogoi et al. | 438/481 |
| 6,936,491 | B2 * | 8/2005 | Partridge et al. | 438/48 |
| 7,098,065 | B2 * | 8/2006 | Chiu et al. | 438/51 |
| 7,160,751 | B2 * | 1/2007 | Chilcott | 438/52 |
| 7,208,800 | B2 * | 4/2007 | Chung et al. | 257/347 |
| 7,352,040 | B2 * | 4/2008 | Partridge et al. | 257/419 |
| 7,585,744 | B2 * | 9/2009 | Gogoi et al. | 438/422 |
| 7,757,393 | B2 * | 7/2010 | Ayazi et al. | 29/847 |
| 8,057,690 | B2 * | 11/2011 | Yu | 216/41 |
| 2003/0141561 | A1 * | 7/2003 | Fischer et al. | 257/415 |
| 2005/0019974 | A1 * | 1/2005 | Lutz et al. | 438/52 |
| 2005/0179099 | A1 * | 8/2005 | Lutz et al. | 257/414 |
| 2007/0042521 | A1 * | 2/2007 | Yama | 438/48 |
| 2007/0072428 | A1 * | 3/2007 | Chilcott | 438/694 |

(Continued)

OTHER PUBLICATIONS

Brosinhan, Timothy. "Embedded Interconnect and Electrical Isolation for High-Aspect-Ratio SOI Inertial Instruments." Transducers, 1997 International Conference on Solid State Sensors and Actuators (1997): 637-40.*

(Continued)

*Primary Examiner* — Thomas L Dickey
*Assistant Examiner* — Joseph Schoenholtz
(74) *Attorney, Agent, or Firm* — Jacqueline J. Garner; Wade J. Brady, III; Frederick J. Telecky, Jr.

(57) ABSTRACT

A fully embedded micromechanical device and a system on chip is manufactured on an SOI-substrate. The micromechanical device comprises a moveable component having a laterally extending upper and lower surface and vertical side surfaces. The upper surface is adjacent to an upper gap which laterally extends over at least a part of the upper surface and results from the removal of a shallow trench insulation material. The lower surface is adjacent to a lower gap which laterally extends over at least a part of the lower surface and results from the removal of the buried silicon oxide layer. The side surfaces of the movable component are adjacent to side gaps which surround at least a part of the vertical side surfaces of the moveable component and result from the removal of a deep trench insulation material.

13 Claims, 4 Drawing Sheets

(56) References Cited

U.S. PATENT DOCUMENTS

| | | | |
|---|---|---|---|
| 2007/0119252 A1* | 5/2007 | Adams et al. | 73/510 |
| 2007/0172976 A1* | 7/2007 | Partridge et al. | 438/53 |
| 2007/0236313 A1* | 10/2007 | Wallis et al. | 335/220 |
| 2008/0122020 A1* | 5/2008 | Metz et al. | 257/415 |
| 2008/0151345 A1* | 6/2008 | Zhou | 359/224 |
| 2010/0176465 A1* | 7/2010 | Yama et al. | 257/415 |
| 2010/0176489 A1* | 7/2010 | Ayazi et al. | 257/595 |
| 2010/0181173 A1* | 7/2010 | Rodriguez et al. | 200/181 |
| 2010/0313660 A1* | 12/2010 | Nishikage et al. | 73/514.32 |
| 2011/0056296 A1* | 3/2011 | Kanemoto | 73/514.32 |
| 2011/0115038 A1* | 5/2011 | Kanemoto | 257/418 |
| 2011/0165718 A1* | 7/2011 | Lutz et al. | 438/51 |

OTHER PUBLICATIONS

Partridge, A.; Rice, A.E.; Kenny, T.W.; Lutz, M.; , "New thin film epitaxial polysilicon encapsulation for piezoresistive accelerometers," Micro Electro Mechanical Systems, 2001. MEMS 2001. The 14th IEEE International Conference on , pp. 54-59, 2001.*

Tabatabaei, S., Partridge, A., "Silicon MEMS Oscillators for High-Speed Digital Systems", Micro, IEEE, pp. 80-89 vol. 30, Issue: 2, Mar.-Apr. 2010.*

Hochst, A. "Stable Thin Film Encapsulation of Acceleration Sensors Using Polycrystalline Silicon as Sacrificial and Encapsulation Layer." Sensors and Actuators A: Physical 114.2-3 (2004): 355-61.*

* cited by examiner

FULLY EMBEDDED MICROMECHANICAL DEVICE, SYSTEM ON CHIP AND METHOD FOR MANUFACTURING THE SAME

FIELD OF THE INVENTION

The invention relates to a fully embedded micromechanical device and to a system on chip comprising an integrated circuit and a fully embedded micromechanical device. The invention further relates to a method for manufacturing the fully embedded micromechanical device and to a method for manufacturing the system on chip using a silicon on insulator (SOI) substrate.

BACKGROUND

Beside its favorable electronic properties, silicon has become increasingly attractive as a material for manufacturing micromechanical devices (MEMS-devices). These devices offer a wide range of applications ranging from actuators to a plurality of different sensors, e.g. accelerometers for detecting a car acceleration and for triggering safety equipment such as an airbag. Often, the sensor uses electrostatic actuation and capacitive read-out for detecting a displacement of a movable component with respect to a static component of the micromechanical device.

A variety of different technologies for manufacturing MEMS-devices have been developed in the recent time. An exemplary technical approach is surface micromechanics. According to this technique, thin films are grown or deposited on a substrate or wafer surface. The silicon substrate itself merely acts as a base for the micromechanical structures while the movable parts of the MEMS-device are manufactured out of the deposited thin film material. This however leads to a maximum thickness of a few micrometers for the movable components of the MEMS-device. Further, intrinsic stress in the deposited structures or films may deteriorate these devices.

A further approach for manufacturing MEMS-devices are bulk micromechanics. The MEMS-devices are made from the typically monocrystalline silicon wafer material, preferably by etching the respective structures. The main benefit of bulk micromechanics is the large mass which is available for the movable parts of the MEMS-device. This may be advantageous, especially for the design of accelerometers. Further, the inferior electronic properties of single crystalline silicon may be of interest. However, for manufacturing active and/or passive components, a combination of different thermal processing steps is needed for determining their specific electrical properties. If a MEMS-device should be integrated in such a device comprising active and passive components, these thermal processing steps have to be changed. Consequently, both, the optimum performance for demanding new technologies comprising passive and active devices and the maximum sensitivity of micromechanical components are difficult if not impossible to achieve.

Recently, another technology for manufacturing MEMS-devices is becoming more and more attractive. Silicon on insulator (SOI) substrates or wafers which are known from the production of high-grade integrated circuits (IC) are applied for manufacturing MEMS-devices. Preferably, the monocrystalline silicon layer which is arranged on a buried silicon oxide layer is applied for manufacturing e.g. a movable component of the MEMS-device.

A further step towards the design of complex micro-electromechanical systems is the integration of an integrated circuit, i.e. an electronic device (IC-device) and a MEMS-device on a single substrate. For this appealing concept, there are different approaches for manufacturing such a system. In principle, the MEMS-device may be fabricated before the IC-device or vice versa. This however demands for complex backend integration of the two parts. If the MEMS-device is fabricated first, it has to be taken into account that a prerequisite for the later IC process is the availability of a smooth high quality single crystalline silicon surface for active device processing. Typically, the wafer surface has to be planarized. Further, the MEMS structure has to withstand the harsh semiconductor fabrication process conditions including high temperature steps, ion implantations, etching steps, etc. On the other hand, if the IC device is fabricated first, especially the metallization has to withstand high temperature annealing steps which are necessary for stress control and curing of the MEMS part. Typically, this is not compatible with the IC metallization scheme or shallow junctions which are needed in modern circuits. A further drawback of this approach is the integration of process steps and the redesign of the device to allow a release of the movable part. Large spacings or cost intensive mask steps may be necessary to perform this mechanic release of the micromechanical part without affecting the integrated circuit on the other hand.

A more sophisticated approach is a mixed process where the fabrication steps for the IC- and MEMS-device are interleaved.

SUMMARY

It is an object of the invention to provide an improved micromechanical device and system on chip and an improved method for manufacturing the same.

In an aspect of the invention, a fully embedded micromechanical device which is manufactured from a silicon on insulator substrate (SOI-substrate) is provided. The SOI-substrate comprises a silicon substrate layer, a buried silicon oxide layer and a monocrystalline silicon layer. Preferably, the silicon substrate layer is the base or handling layer of the SOI-silicon wafer. The buried silicon oxide layer is typically arranged directly on top of the silicon substrate layer. If the SOI substrate is not used for manufacturing a micromechanical device but for manufacturing a semiconductor device, this monocrystalline silicon layer will be used for manufacturing the active and/or passive components or integrated circuits of the semiconductor device.

The micromechanical device (in the context of this specification also referred to as a MEMS-device) according to aspects of the invention may be a part of a system on chip semiconductor device which further comprises active and/or passive components or integrated circuits. Within the context of this specification, active and passive components and integrated circuits will also refer to as IC-device(s). In other words, the system on chip semiconductor device may comprise one or more IC-devices and one or more MEMS-devices which both are arranged on a single SOI-substrate.

The micromechanical device according to aspects of the invention comprises a movable component having upper, lower and vertical surfaces. The upper and lower surfaces extend laterally. The vertical side surfaces extend perpendicular to the upper and lower surfaces. Preferably, the movable component is a cantilever. A deflection of the cantilever may take place in a lateral plane, i.e. substantially in parallel to the substrate surface. In other words, during deflection of the cantilever and depending on the direction of movement of the same, the respective vertical side surfaces of the cantilever are exposed to compressive and tensile stress, respectively.

According to further aspects of the invention, the upper surface of the movable component is adjacent to an upper gap which laterally extends over at least a part of the upper surface. This gap may result from the removal of a shallow trench insulation material. The lower surface of the movable component is adjacent to a lower gap which laterally extends over at least a part of the lower surface. This lower gap preferably results from the removal of the buried oxide layer. The vertical side surfaces of the movable component may be adjacent to side gaps surrounding these vertical side surfaces at least partially. The side gaps may result from the removal of a deep trench insulation material.

Advantageously, the MEMS-device according to aspects of the invention offers mechanical properties which are typically known from bulk micromechanics. However, typical drawbacks of bulk micromechanics may be overcome and a scalable process may be provided.

The MEMS-device according to aspects of the invention may be part of a highly integrated system on chip (within the context of this specification also referred to as a SOC). This system may comprise a MEMS-device and sensors, analogue and/or digital units (IC-devices) which form part of a single device solution. Advantageously, the complete SOC, i.e. the IC-device and the MEMS-device may be manufactured using bipolar CMOS technology which is advantageous because this technology supports very stable aspect ratios.

In another aspect of the invention, the MEMS-device comprises an anchor portion for fastening the movable component. Preferably, the anchor portion extends vertically through the monocrystalline silicon layer and through the buried silicon oxide layer down to the silicon substrate layer. The anchor portion may be laterally adjacent and mechanically connected to the movable component. Advantageously, the anchor portion allows providing a MEMS-device having a movable component, e.g. a cantilever which is made out of monocrystalline silicon.

According to another advantageous aspect of the invention, a barrier is provided which surrounds at least the movable component of the MEMS-device. Preferably, the barrier extends vertically through at least the buried silicon oxide layer down to the silicon substrate layer. The barrier may be made out of polysilicon and therefore it provides a barrier for hydrofluoric acid which is preferably used for removing the deep trench material.

Advantageously, the MEMS-device may be integrated in a complex system (e.g. a SOC solution) which further comprises additional MEMS-device or IC-devices in neighboring areas of the MEMS-device according to aspects of the invention. A high integration density may be provided on a single substrate or wafer without having a high risk for damage of the electrically insulating silicon oxide layer (of the SOI-substrate) in the neighboring structures due to the deep trench etching. This is mainly due to the polysilicon barrier which provides a barrier for the hydrofluoric acid which is preferably used for removing the deep trench material.

It is further advantageous if the anchor portion and the barrier are manufactured from the same material and within the same process step. This will minimize the production costs for manufacture of the embedded MEMS-device.

Preferably, the barrier is a dual barrier comprising interleaved walls which vertically extend through at least the buried silicon oxide layer down to the silicon substrate layer. Advantageously, a reliable barrier for the etching solvent which is used during deep trench etching may be provided. Further, the dual barrier concept allows stress compensation between the MEMS-device and further units which are arranged on the same substrate in the vicinity of the MEMS-device.

In another aspect of the invention, a further layer covers the upper gap and this further layer comprises a sealed access opening extending from an outside surface of the micromechanical device to the shallow trench insulation layer. Preferably, this layer may be due to further processing steps in an integrated production process for manufacturing a semiconductor device (e.g. a SOC) which comprises a MEMS-device as well as an IC-device. The further layer may protect at least the movable component of the MEMS-device.

According to another advantageous aspect of the invention, a method of manufacturing a fully embedded micromechanical device is provided. A silicon on insulator substrate (SOI-substrate) is used for manufacturing the micromechanical device. In a first step, a shallow trench insulation layer which may be vertically adjacent to the movable component of the MEMS-device, may be provided. The shallow trench laterally extends over at least a part of an upper surface of the movable component. In a further process step, a deep trench insulation layer which may be laterally adjacent to vertical side surfaces of the movable component, may be manufactured. Preferably, the deep trench insulation layer vertically extends from the shallow trench down to the buried silicon oxide layer. According to a further step of the method for manufacturing the fully embedded MEMS-device, shallow trench, deep trench and buried insulator layer material is removed so as to provide a movable component of the MEMS-device. The movable component may be a cantilever which is manufactured from the monocrystalline silicon layer of the SOI-substrate. Preferably, this step of removing shallow trench, deep trench and buried insulator layer material is a wet chemical etching step.

Advantageously, the method of manufacturing the MEMS-device may be easily integrated into the process flow for production of a semiconductor device comprising an IC-device and a MEMS-device, because the steps of manufacturing the micromechanical device according to aspects of the invention are steps which are typically known from bipolar CMOS technology. This integration opens up the pathway for manufacture of highly integrated system on chip solutions.

According to another aspect of the invention, the deep trench is surrounding at least a part of the vertical side surfaces of the movable component. Further, an anchor portion for fastening the movable component may be manufactured, wherein the anchor portion may vertically extend through the monocrystalline silicon layer and the buried silicon oxide layer down to the silicon substrate layer. The anchor portion may be laterally adjacent and mechanically connected to the movable component. Advantageously, a MEMS-device having a movable part, e.g. a cantilever which is made from monocrystalline silicon and which is fully buried or embedded may be provided. Manufacturing of this device may be performed using typical process steps which are known from bipolar CMOS-technology.

In another aspect of the invention, a barrier which may vertically extend through at least the buried silicon oxide layer down to the silicon substrate may be manufactured. The barrier surrounds at least the movable component of the MEMS-device. Advantageously, during the step of removal of the buried silicon oxide layer, the barrier prevents hydrofluoric acid from accessing parts of a neighboring component of the micromechanical device. This is especially advantageous for integrated semiconductor devices comprising a MEMS-device and an IC-device.

Advantageously, an access opening may be inserted in a further layer which is present on top of the shallow trench insulation layer. The access opening preferably extends from an outside surface of the MEMS-device to the shallow trench insulation layer. Advantageously, hydrofluoric acid may access the MEMS-structure in a wet chemical etching step for removal of the shallow trench, deep trench and buried silicon oxide insulation layer material. According to an aspect of the invention, the access opening is sealed in a subsequent step after removal of the shallow trench, deep trench and buried insulator material. Advantageously, the sealing-step is performed by low pressure chemical vapor deposition (LPCVD). The movable part of the MEMS-device is sealed up in vacuum which guarantees a free movement thereof. Therefore, the movable part offers almost ideal mechanical properties and performance. The mechanical characteristics of the MEMS device are close to what may be expected from theory. In other words, if the moveable part is a cantilever, the mechanical behavior thereof is close to the ideal/theoretic behavior of a cantilever.

According to an advantageous aspect of the invention a method for manufacturing a system on chip solution may be provided. The system on chip comprises an integrated circuit (IC-device) and a fully embedded micromechanical device. The MEMS device preferably comprises an anchor portion and/or a barrier. During manufacture of the SOC, an opening which extends at least though the buried silicon oxide layer down to the silicon substrate layer is manufactured. Subsequently, silicon is grown and the opening is filled-up. This process step will provide the anchor portion and/or the barrier. Advantageously, the step of growing silicon is an epitaxial growing step and the anchor portion and/or the barrier and parts of the integrated circuit (IC-devices) of a system on chip are manufactured at the same time, i.e. within the same process step.

Preferably, the method for manufacturing the MEMS-device and the method for manufacturing the SOC according to aspects of the invention may be integrated in a CMOS production process. Advantageously, standard packing may be used. Preferably, an SOI-substrate comprising a monocrystalline silicon layer having a height of approximately 5 μm is applied. A preferable width of a cantilever may be about 0.35 μm. Due to the high aspect ratio, the cantilever is very stable with respect to vertical movement but sensitive for lateral displacement of the MEMS-device. This may be advantageous for measuring acceleration in the lateral plane.

In comparison to prior art concepts which apply backend integration of the MEMS-device, advantageously, no further chip backside processing is necessary. In contrast, the MEMS-device may be manufactured within a standard CMOS process. The method of manufacturing the fully integrated in silicon buried MEMS-device is itself modular. If mechanical sensors are needed in SOC solutions it is easy to integrate the method according to aspects of the invention in the existing process. There is no need for redesign or adjustment e.g. of the metallization schemes.

BRIEF DESCRIPTION OF DRAWINGS

Further objects of the invention will ensue from the following description of example embodiments of the invention with reference to the accompanying drawings, wherein.

DETAILED DESCRIPTION OF AN EXAMPLE EMBODIMENT

Figure 1:
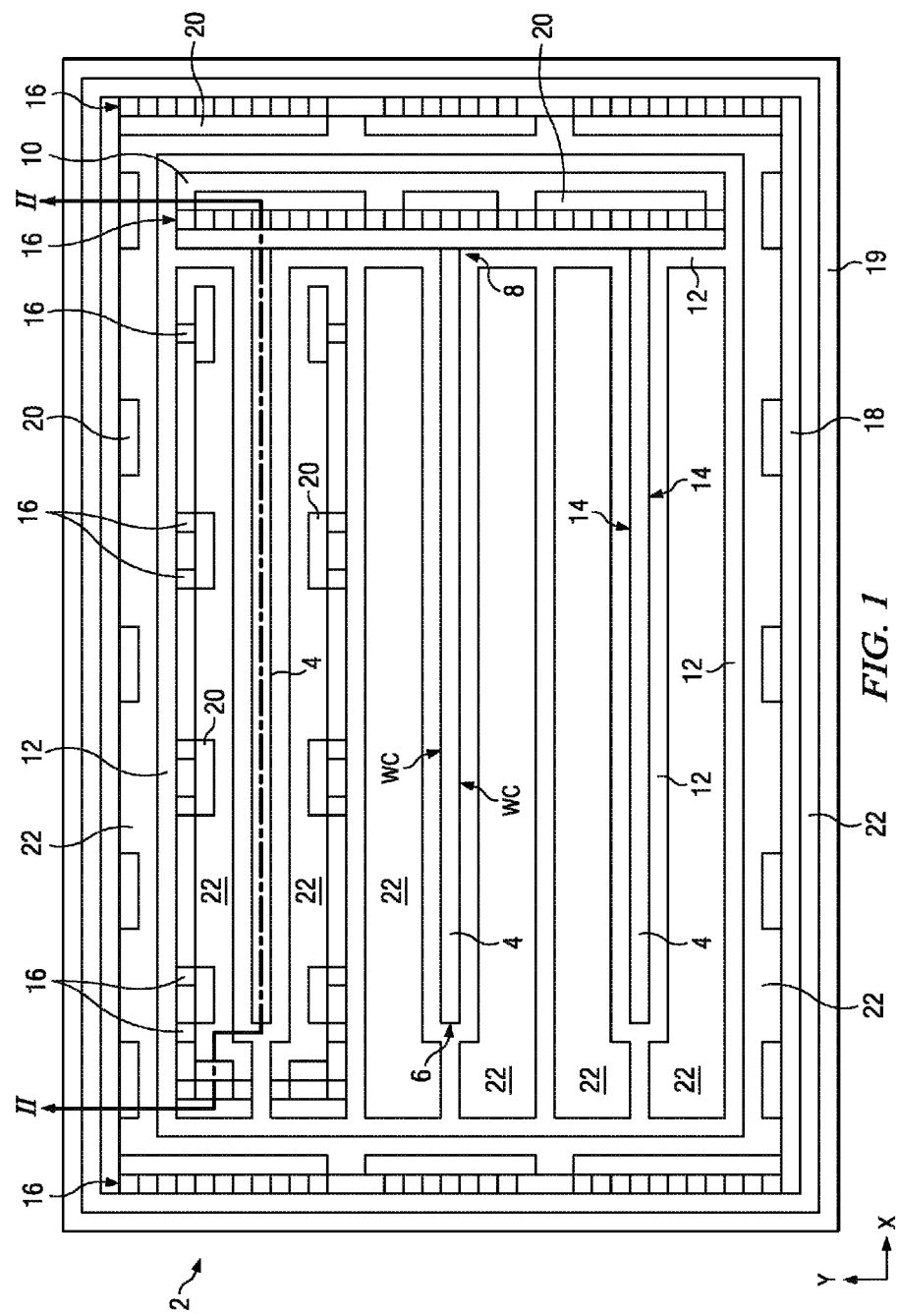
FIG. 1 is a top view to a simplified layout of a micromechanical device according to an embodiment of the invention.

FIG. 1 is a top view of a simplified layout of a micromechanical device 2, in the following also referred to as a MEMS-device, according to an embodiment of the invention. The MEMS-device 2 according to the embodiment comprises three movable components, which are cantilevers 4, by way of an example only. Each cantilever 4 comprises a free end 6 at the tip and an opposite fixed end 8 which connects the cantilever 4 to an anchor 10. There is a deep trench 12 on either longitudinal side wall 14 of the cantilever 4. The deep trench 12 extends along the side walls 14 and the free end 6. Further, the three cantilever systems as well as the anchor 10 are surrounded by the deep trench 12. A shallow trench 22 is located adjacent to the deep trench 12 at both longitudinal sides 14 of the cantilever 4. A plurality of contacts 16 may be arranged in the shallow trenches 22 on either side of the cantilever 4. For clarity reasons, only some of the contacts 16 and some of the access openings 20 (described hereinbelow) are given reference numerals. Further, only for the upper cantilever arrangement or system there are contacts 16 and access openings 20 in FIG. 1. The middle and lower cantilever system may be identical to the upper system, contacts 16 and access openings 20 are omitted in FIG. 1 due to clarity reasons only.

Further, a row of contacts 16 is present in the anchor 10. These are for electrically contacting the cantilever 4. A movement of the cantilever 4 in the X-Y plane (mainly in positive and negative Y-direction) is detected by a capacitive measurement between these contacts 16 in the anchor 10 and the contacts 16 which are located vis-à-vis the side walls 14 of the cantilever 4. Preferably, the capacitive measurement is carried out for all three cantilever systems and an average of the single measurement results is taken as a measurement value of a sensor comprising the MEMS-device 2 according to the embodiment in FIG. 1. This sensor may be an acceleration sensor for detection of in-plane (i.e. in the X-Y plane) acceleration. Further rows of contacts 16 are present in a first barrier 18 surrounding the cantilever setup of the MEMS-device 2. These contacts 16 provide an electrical contact to the backplane, i.e. the substrate, for electrical access of the substrate potential.

In the embodiment of FIG. 1, there is a first and a second barrier 18, 19 which are interleaved. The second barrier 19 surrounds the first barrier 18 inter alia for security reasons. Further, the second barrier 19 allows a stress compensation or a stress decoupling between the MEMS component and integrated circuits which may be arranged in the vicinity of the MEMS-device. This is advantageous for system on chip solutions.

Figure 5:
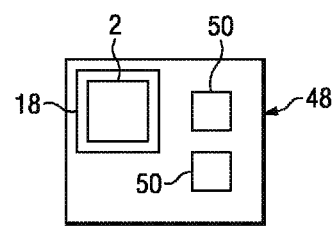
FIG. 5 is a simplified view of a system on chip (SOC) comprising a MEMS device and an IC-device, according to another embodiment of the invention.

FIG. 5 is a simplified top view of system on chip (SOC) 48 comprising a MEMS-device 2 which is surrounded by a barrier 19 and two semiconductor device or IC-devices 50.

When stepping back to the more detailed view of FIG. 1, it becomes clear that the first and second barrier 18, 19 prevent hydrofluoric acid which may be used during removal of shallow trench, deep trench and silicon oxide layer material from penetrating neighboring areas or parts being located on the same substrate in the vicinity of the MEMS-device 2, e.g. the IC-devices 50. The MEMS-device 2 of FIG. 1 may be a part of the SOC 48 in FIG. 5, by way of an example only. The SOC 48 may comprise further semiconductor devices, e.g. sensors, active and/or passive components, IC-devices or further MEMS-devices which may be located in the vicinity of a MEMS-device 2 according to the embodiment of FIG. 1.

For preparation of the movable part of the MEMS-device 2, preferably, hydrofluoric acid is applied for removal of the shallow trench, deep trench and buried silicon oxide layer material. The acid may be applied to the MEMS-device 2 in a wet chemical etching step, wherein the liquid is accessing the MEMS-structure through the access openings 20 (see FIG. 1). For clarity reasons, only some of the access openings 20 which are located in shallow trench areas 22 are given reference numerals.

Figure 2A:
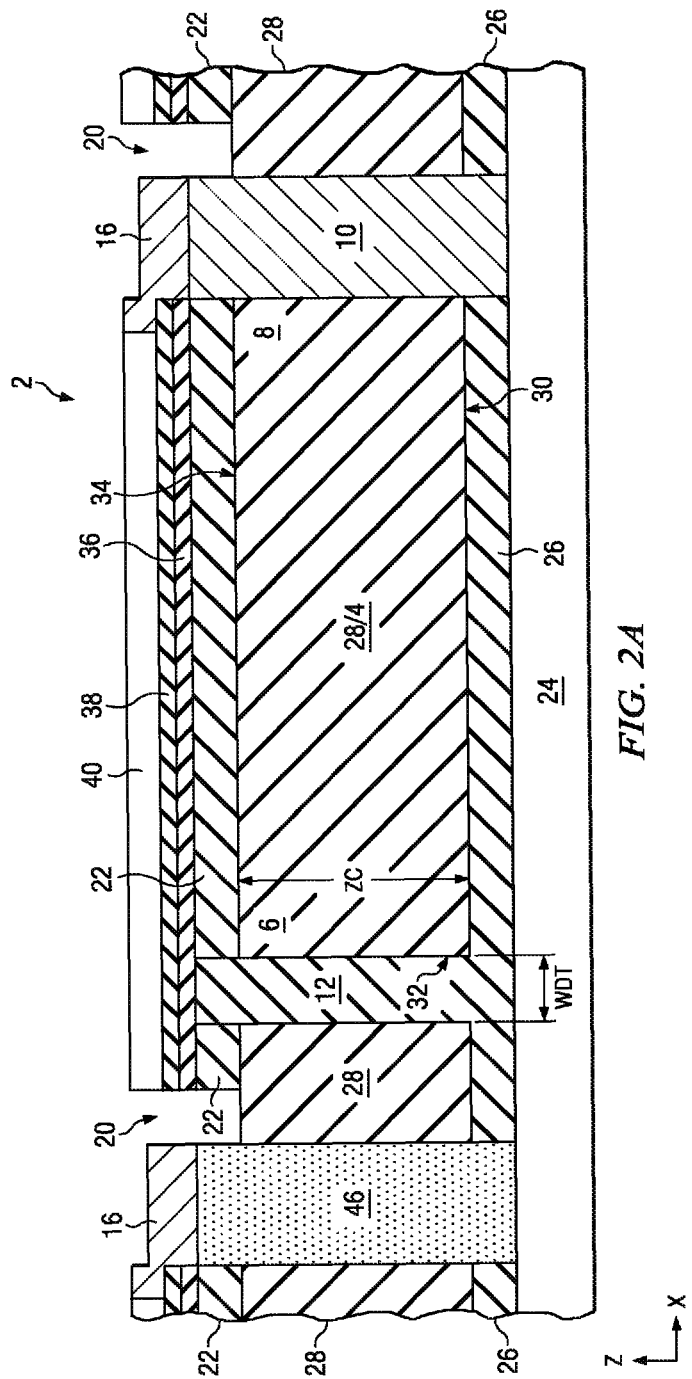
FIGS. 2A and 2B are is a simplified cross-sectional views of the micromechanical device according to FIG. 1.

FIG. 2A is a simplified cross-sectional view along the line II-II in FIG. 1. The MEMS-device 2 is manufactured on a silicon substrate layer 24 which is a base or handling layer of a SOI-substrate. There is a buried silicon oxide layer 26 on top of the silicon substrate layer 24. On top of the buried silicon oxide layer 26 there is a monocrystalline silicon layer 28. The cantilever 4 of the MEMS-device 2 is manufactured from this monocrystalline silicon layer 28. A lower surface 30 of the cantilever 4 is adjacent to the buried silicon oxide layer 26. The free end portion 6, i.e. the tip surface 32 of the cantilever 4 is adjacent to a deep trench 12 which extends from a shallow trench 22 through the monocrystalline silicon layer 28 down to the buried silicon oxide layer 26. An upper surface 34 of the cantilever 4 is adjacent to the shallow trench layer 22. There is fixed end of the cantilever 4 which is opposite to the tip 6. The fixed end is adjacent and mechanically connected to the anchor 10. Preferably, the anchor 10 is manufactured from polysilicon and has the same type of doping, i.e. the same conduction type like the monocrystalline silicon layer 28. The anchor 10 extends through the shallow trench 22, the monocrystalline silicon layer 28 and the buried silicon oxide layer 26 down to the silicon substrate layer 24. Preferably, the anchor 10 is manufactured in combined process step which may be advantageous for manufacture of SOCs. The silicon of the anchor 10 may be grown in an epitaxial growth step which—at the same time—serves as an epitaxial growth step for an IC-device of the SOC. The silicon substrate 24 itself may have a different type of doping and may use the opposite conducting type as the anchor 10 at the anchor point. A contact 16 may be provided on top of the anchor 10 for electrically contacting the cantilever 4.

Figure 2B:
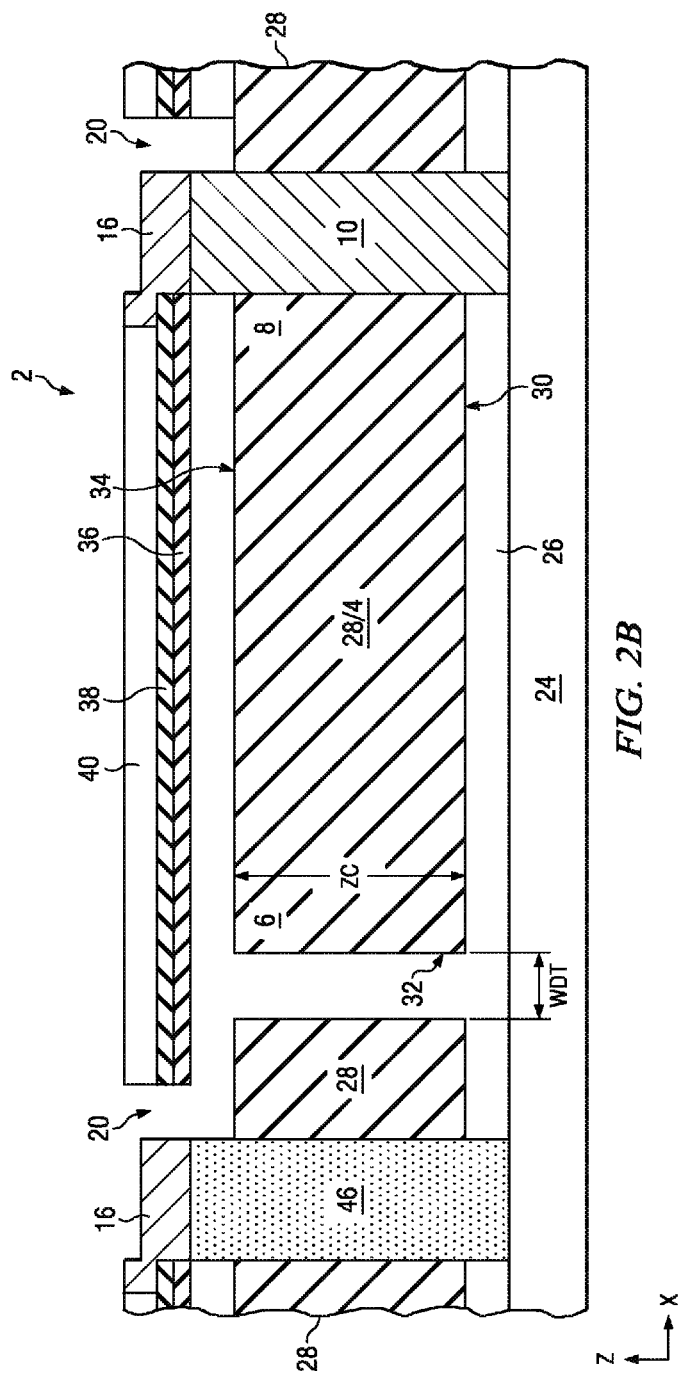

The MEMS-device 2 comprises further layers on top of the shallow trench layer 22. These layers may be due to further CMOS production steps. By way of an example only, a silicon oxide layer 36, a silicon nitride layer 38 and an emitter polysilicon layer 40 may be deposited on top of the shallow trench 22. Access openings 20 are inserted in these layers (36, 38, 40), wherein the access openings 20 extend down to the shallow trench layer 22. For removal of the shallow trench 22, deep trench 12 and buried silicon oxide layer 26 material, hydrofluoric acid may access the MEMS-device 2, preferably in a wet chemical etching step. The etch-process of the buried silicon oxide layer 26 and the shallow trench 22 is stopped (in lateral direction) by the anchor 10 on the one hand and a diffusion under fill (DUF) 46/barrier on the other hand. Similar to the anchor 10, the DUF 46 is manufactured from polysilicon and extends through the shallow trench 22, the monocrystalline layer 28 and the buried silicon oxide layer down to the silicon substrate layer 24. Portions of DUF 46 are used to form barriers 18 and 19. Since both, the anchor 10 and the DUF are manufactured from polysilicon, the attack of the hydrofluoric acid will stop at these layers. In the etching step, the shallow trench 22, deep trench 12 and buried silicon oxide layer 26 are removed and the cantilever 4 is exposed as shown in FIG. 2B. After this processing step, the cantilever 4 will be free and will be solely fixed by the anchor 10. Therefore, the cantilever 4 is free to move, however, mainly in the X-Y plane.

This preferable direction of displacement is mainly due to the height to width ratio of the cantilever 4. The thickness ZC of the cantilever 4 is preferably about 5 µm. The width WDT of the deep trench 12 and a width of the cantilever WC is about 0.35 µm (see FIG. 1). Accordingly, the height to width ratio of the cantilever 4 is about 10 to 1 which means the cantilever 4 is pretty stiff in a vertical direction (i.e. in Z-direction) and more flexible in the X-Y plane.

After removal of the shallow trench 22, deep trench 12 and buried silicon oxide layer 26 material, the access opening 20 is sealed preferably in a low pressure chemical vapor deposition step (LPCVD). These processing steps will be illustrated by the simplified cross-sectional view of FIG. 3 and FIG. 4.

Figure 3:
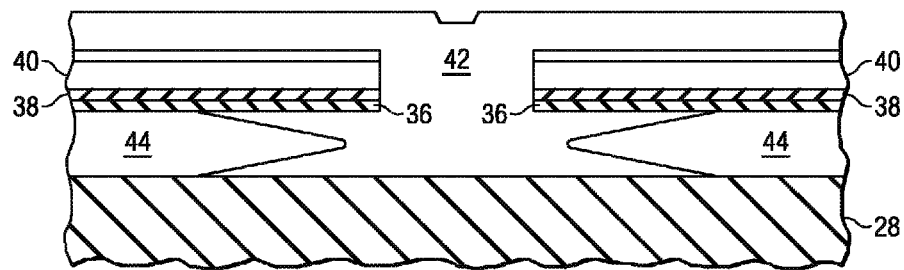
FIG. 3 and FIG. 4 are further simplified cross-sectional views illustrating the sealing of the access opening after removal of deep trench, shallow trench and buried silicon oxide layer removal, according to a further embodiment of the invention.
Figure 4:
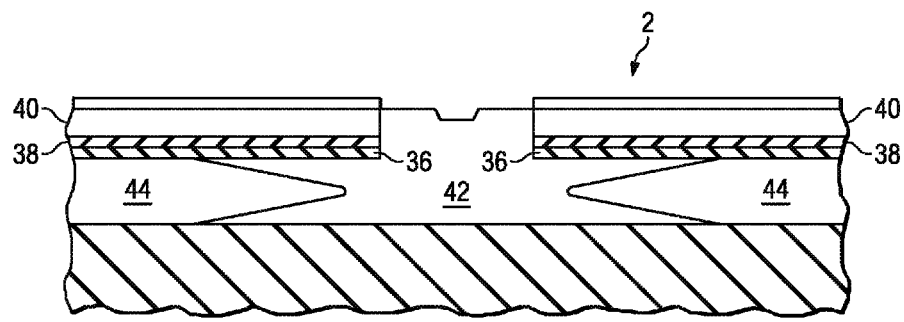

In FIG. 3, the access opening between the n-emitter polysilicon 40 and the further layers 36, 38 is sealed with a polysilicon seal 42. The shallow trench has been removed and accordingly there is an upper gap 44 left. This gap extends left and right from the seal 42. Advantageously, the remaining gaps are evacuated during the LPVCD deposition step. Therefore, the deviation or movement of the movable part i.e. the cantilever 8 takes place in an atmosphere having low pressure. This may be advantageous, e.g. because of reduced friction of the moving cantilever 4. The mechanical characteristics of the cantilever 4 will be near to the characteristic which is predicted from theory. In a further process step which is depicted in FIG. 4, the plug 42 has undergone an etchback step and consequently a smooth surface of the MEMS-device 2 is provided. This surface is advantageously suitable for further deposition and/or structuring e.g. of IC-devices.

Although the invention has been described hereinabove with reference to specific embodiments, it is not limited to these embodiments and no doubt further alternatives will occur to the skilled person that lie within the scope of the invention as claimed.

The invention claimed is:

1. A fully embedded micromechanical device manufactured from a silicon on insulator substrate (SOI-substrate) comprising a silicon substrate layer, a buried silicon oxide layer and a monocrystalline silicon layer, wherein the micromechanical device comprises:
   a moveable component having a laterally extending upper and lower surface and vertical side surfaces and wherein
   a. the upper surface is adjacent to an upper gap laterally extending over at least a part of the upper surface and resulting from the removal of a shallow trench insulation material,
   b. the lower surface is adjacent to a lower gap laterally extending over at least a part of the lower surface and resulting from the removal of the buried silicon oxide layer,
   c. the vertical side surfaces of the moveable component are adjacent to side gaps surrounding at least a part of the vertical side surfaces of the moveable component and resulting from the removal of a deep trench insulation material, and a barrier surrounding at least the movable component, wherein the barrier vertically extends through at least the buried silicon oxide layer down to the silicon substrate layer.

2. The fully embedded micromechanical device according to claim 1, further comprising an anchor portion for fastening the movable component, wherein the anchor portion vertically extends through the monocrystalline silicon layer and the buried silicon oxide layer down to the silicon substrate layer and wherein the anchor portion is laterally adjacent and mechanically connected to the movable component.

3. The fully embedded micromechanical device according to claim 1, wherein the barrier is a dual barrier comprising interleaved walls vertically extending through at least the buried silicon oxide layer down to the silicon substrate layer.

4. The fully embedded micromechanical device according to claim 1, comprising a further layer covering the upper gap, wherein the further layer comprises a sealed access opening extending from an outside surface of the micromechanical device to a shallow trench.

5. The fully embedded micromechanical device according to claim 1, wherein the movable component is a cantilever.

6. System on chip comprising a fully embedded micromechanical device according to claim 1 and an integrated circuit.

7. A method for manufacturing a fully embedded micromechanical device using a silicon on insulator substrate (SOI-substrate) comprising a silicon substrate layer, a buried silicon oxide layer and a monocrystalline silicon layer, the method comprising the steps of:
   a. manufacturing a shallow trench insulation layer which is vertically adjacent to a movable component of the micromechanical device and which laterally extends over at least a part of an upper surface of the movable component,
   b. manufacturing a deep trench insulation layer which is laterally adjacent to vertical side surfaces of the movable component and which is vertically extending from the shallow trench down to the buried silicon oxide layer,
   c. removing shallow trench, deep trench and buried insulator layer materials so as to provide a movable component of the micromechanical device out of the monocrystalline silicon layer; and
   d. manufacturing a barrier which vertically extends through at least the buried silicon oxide layer down to the silicon substrate and which laterally surrounds at least the movable component.

8. The method of manufacturing the fully embedded micromechanical device according to claim 7, wherein the deep trench surrounds at least a part of the vertical side surface of the movable component.

9. The method of manufacturing the fully embedded micromechanical device according to claim 7, further comprising the step of manufacturing an anchor portion for fastening the movable component, wherein the anchor portion vertically extends through the monocrystalline silicon layer and the buried silicon oxide layer down to the silicon substrate layer and wherein the anchor portion is laterally adjacent and mechanically connected to the movable component.

10. The method of manufacturing the fully embedded micromechanical device according to claim 7, wherein a further layer is present on top of the shallow trench insulation layer and the method further comprises the step of inserting an access opening in the further layer, wherein the access opening extends from an outside surface of the micromechanical device to the shallow trench insulation layer.

11. The method of manufacturing the fully embedded micromechanical device according to claim 10, further comprising the step of sealing the access opening after removal of shallow trench, deep trench and buried insulator layer material.

12. The method of manufacturing a fully embedded micromechanical device according to claim 7, wherein the step of removing shallow trench, deep trench and buried insulator layer material is a wet chemical etching step.

13. A method for manufacturing a system on chip comprising an integrated circuit and a fully embedded micromechanical device which is manufactured according to claim 9, wherein the step of manufacturing the anchor portion and/or the barrier comprises: inserting an opening which extends at least though the buried silicon oxide layer down to the silicon substrate layer and growing silicon for filling-up the opening and for manufacturing the anchor portion and/or the barrier, wherein the step of growing silicon is an epitaxial growing step and the anchor portion and/or the barrier and parts of the integrated circuit of a system on chip are manufactured at the same time.

* * * * *